United States Patent [19]
Pryor et al.

[11] Patent Number: 4,771,537
[45] Date of Patent: Sep. 20, 1988

[54] METHOD OF JOINING METALLIC COMPONENTS

[75] Inventors: Michael J. Pryor, Woodbridge; William G. Watson, Cheshire, both of Conn.

[73] Assignee: Olin Corporation, New Haven, Conn.

[21] Appl. No.: 811,910

[22] Filed: Dec. 20, 1985

[51] Int. Cl.[4] .............................................. H05K 3/36
[52] U.S. Cl. ...................................... 29/830; 174/68.5; 228/117; 228/194; 361/414
[58] Field of Search ................... 29/830; 339/17 E; 361/414; 174/68.5; 228/194, 117

[56] References Cited

U.S. PATENT DOCUMENTS

| | | |
|---|---|---|
| 3,264,524 | 8/1966 | Dahlgren et al. .................. 174/68.5 |
| 3,676,292 | 7/1972 | Pryor et al. . |
| 3,726,987 | 4/1973 | Pryor et al. . |
| 3,728,177 | 4/1973 | Caule . |
| 3,845,543 | 11/1974 | Roth et al. ....................... 228/194 X |
| 3,854,194 | 12/1974 | Woodward ......................... 228/194 |
| 3,902,544 | 9/1975 | Flemings et al. .................... 164/485 |
| 3,921,285 | 11/1975 | Krall .............................. 174/68.5 X |
| 3,922,777 | 12/1975 | Weitze et al. ................... 361/414 X |
| 3,935,986 | 2/1976 | Lattari et al. .................... 228/194 X |
| 4,038,041 | 7/1977 | Duvall et al. .................... 228/117 X |
| 4,106,956 | 8/1978 | Bercovici ........................ 148/11.5 A |
| 4,149,910 | 4/1979 | Popplewell . |
| 4,179,802 | 12/1979 | Joshi et al. ............................ 29/830 |
| 4,249,302 | 2/1981 | Crepeau ................................ 29/830 |
| 4,330,599 | 5/1982 | Winter et al. . |
| 4,331,286 | 5/1982 | Miyazaki et al. ............... 228/194 X |
| 4,362,262 | 12/1982 | Winter et al. . |
| 4,410,927 | 10/1983 | Butt . |
| 4,429,022 | 1/1984 | Breedis et al. . |
| 4,461,924 | 7/1984 | Butt . |
| 4,480,262 | 10/1984 | Butt . |
| 4,491,622 | 1/1985 | Butt ..................................... 29/830 R |
| 4,498,121 | 2/1985 | Breedis et al. . |
| 4,500,028 | 2/1985 | Breedis et al. . |
| 4,500,605 | 2/1985 | Fister et al. . |
| 4,521,469 | 6/1985 | Butt et al. . |
| 4,524,238 | 6/1985 | Butt . |
| 4,525,422 | 6/1985 | Butt et al. . |
| 4,532,222 | 7/1985 | Butt . |
| 4,542,259 | 9/1985 | Butt . |
| 4,569,692 | 2/1986 | Butt . |
| 4,570,337 | 2/1986 | Butt . |
| 4,577,056 | 3/1986 | Butt . |
| 4,594,770 | 6/1986 | Butt . |
| 4,607,276 | 8/1986 | Butt . |
| 4,625,400 | 12/1986 | Fister . |
| 4,649,083 | 3/1987 | Fister et al. . |
| 4,656,499 | 4/1987 | Butt . |
| 4,659,504 | 4/1987 | Butt . |

FOREIGN PATENT DOCUMENTS 1456994  12/1976  United Kingdom .................. 29/830

Primary Examiner—Howard N. Goldberg
Assistant Examiner—Carl J. Arbes
Attorney, Agent, or Firm—Gregory S. Rosenblatt; Paul Weinstein

[57] ABSTRACT

A method of joining metallic layers of foil is disclosed. The layers of foil are spaced apart from each other a desired distance. A metallic component disposed between the layers of foil is in selective contact with each of them. The metallic component is selected to be in the semi-solid condition at a desired processing temperature. The assembly is heated to the processing temperature. The the assembly is cooled so that the metallic component is bonded to the metallic layers of foil.

16 Claims, 1 Drawing Sheet

METHOD OF JOINING METALLIC COMPONENTS

This application is related to U.S. patent application Ser. No. 707,636, entitled "Pin Grid Arrays", by Michael J. Pryor, filed Mar. 4, 1985 (now abandoned); U.S. patent application Ser. No. 811,905, entitled "Hybrid And Multi-Layer Circuitry", by Michael J. Pryor et al., filed Dec. 20, 1985; and U.S. patent application Ser. No. 811,906, entitled "Multi-Layer And Pin Grid Arrays", by Michael J. Pryor, filed Dec. 20, 1985.

While the invention is subject to a wide range of applications, it is particularly suited for joining two layers of metallic strip together by a third interconnecting metal member wherein the two layers of metal strip are maintained at a desired distance from each other. In particular, the layers of metal may be multi-layer circuitry separated by a glass or ceramic substrate composite having through-holes into which the interconnecting metal is disposed.

Joining metals is conventionally achieved by three general techniques or variations thereof. These include brazing, soldering, and welding. In brazing, metal components are joined by flowing a thin layer of non-ferrous filler metal into the space between them. The bonding results from the intimate contact produced by the dissolution of a small amount of base metal in the molten filler metal without significant diffusion into the base metal. Usually, the temperature exceeds some arbitrary value such as 800° F. The term soldering is similar to brazing except the temperature is lower than the arbitrary value. Welding typically means joining two or more pieces of metal by applying heat, pressure, or both, with or without filler metal to produce a localized union through fusion or recrystallization across the interface. In each of these techniques, the metal components being joined are either in direct contact or positioned close to one another. However, where the two metal components are separated from each other by a desired distance, the application of these techniques becomes more cumbersome. The present invention is a straight forward approach to joining metal components separated from each other by a desired distance. The invention has particular applicability to constructing multi-layer circuit devices of metal circuit foils separated by one or more ceramic substrates.

Through-hole connections in multi-layer circuitry are typically made by the insertion of metallic pastes comprising a metal powder and an organic binder. The circuitry is then heated to sinter the metal powder and expel the binder. Because of the constricted geometry in the diameter of the through-hole, typically about 3 to about 10 mils, the binder is seldom completely expelled. The resulting sintered metal particles have a relatively low density and high electrical resistance. In conventional multi-layer circuitry, the problem is exacerbated by the necessity of having to use very high melting point metals, such as tungsten and moly-manganese, whose electrical resistance is very high.

The present invention has particular applications for through-hole connections in multi-layer circuitry of the type described in U.S. patent application Ser. No. 811,905, 16096-MB) entitled "Hybrid and Multi-Layer Circuitry" by Michael J. Pryor et al. A requirement of through-hole circuitry in this method of making a multi-layer product differs substantially from the cofired approach where the circuitry is screen printed on the green tape with cofiring being done at temperatures in the vicinity of 1600° C. The process in the Pryor et al. application, contemplates attaching copper alloy circuitry with a bonding glass at substantially lower temperatures within the range of about 600° to about 1000° C. Under these lower temperature conditions, conventional through-hole multi-layer approaches are not suitable. Also, thick film types of paste, with lead borate glass is unsuitable because the lead would be reduced during the firing cycle and form unwanted electrical paths.

It is a problem underlying the present invention to bond metallic components separated from each other with a metal alloy interconnect component.

It is an advantage of the present invention to provide a method of joining two metallic components which obviate one or more of the limitations and disadvantages of the described prior process and arrangements.

It is a further advantage of the present invention to provide a method of joining two metallic components so that the components are separated by a fixed distance.

It is a yet further advantage of the present invention to provide a method of joining two metallic components by a relatively inexpensive process.

Accordingly, there has been provided a method of joining two or more metallic components. The at least two metallic components are spaced apart from each other a desired distance. A metal alloy bonding component is disposed in the space between the first and second metallic components. The resulting assembly is heated to a processing temperature to join the three metal components together. The metal alloy bonding component is selected to have a composition which is in the semi-solid condition with a volume percentage of liquid from about 2 -to about 40% at a desired temperature range which includes the process temperature to which the assembly is heated. Then, the assembly is cooled and the metal alloy bonding component is bonded to both the first and second metallic components.

The invention and further developments of the invention are now elucidated by means of the preferred embodiments in the drawings.

Figure 1:
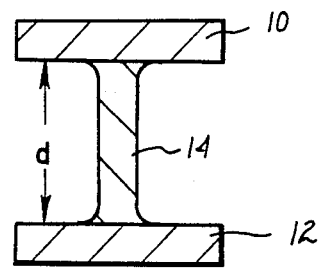
FIG. 1 illustrates two metal components separated by a desired distance and joined together by a third metal alloy component in accordance with the present invention.

The present invention is directed to a method of joining metallic components as illustrated in FIG. 1. The method includes providing a first metal or alloy component 10 and a second metal or alloy component 12. The second metallic component is spaced a desired distance d from the first metallic component. A first metal alloy bonding component 14 is disposed between and in selective contact with the metallic components 10 and 12. The assembly of the first and second metallic components and the first bonding component is heated to a processing temperature at which the metal alloy bonding component is in the semi-solid condition with a volume percent of liquid from about 2 to about 40%. Then, the assembly is cooled so that the first metal alloy bonding component is bonded to the first and second metallic components. It is thought that solidification of the liquid component of the third metal alloy component plays an important part on bonding process.

The metallic components 10 and 12 may be formed of any desired metal or alloy. Although they are illustrated as layers, they may be of any desired shape and spaced apart from each other by any desired distance d. Further, it is within the terms of the invention to bond together any desired number of metallic components.

The bonding component 14 is selected from a metal alloy which is in the semi-solid condition at a temperature below the melting point of the metal components 10 and 12. The semi-solid condition is defined as having a volume percent of liquid from about 2 to about 40% and preferably between about 10 to about 30%. The material selected for the bonding metal is an alloy because it has a range of melting points depending on the composition. The composition of the alloy is selected so that in the semi-solid condition it is able to substantially maintain its shape at the processing temperature range. The bonding is principally accomplished with the solidification of the liquid portion of the metal alloy in semi-solid condition. It would seem that an increase in the amount of liquid would enhance the strength of the bonding. However, as the amount of liquid increases, the tendency of the bonding alloy to slump, i.e. either distort or collapse, also increases. If the bonding alloy slumps too much, the bonding will either be very weak or non-existent. The shape of the bonding material may be either a wire, rod, foil or any other desired shape.

Figure 2A:
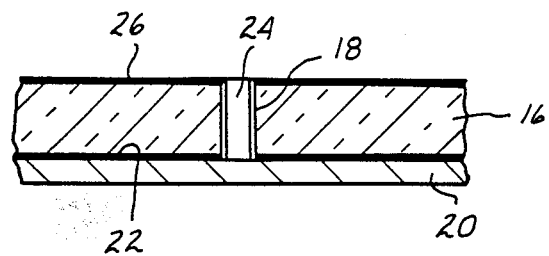
FIGS. 2A and 2B illustrate the series of steps necessary to join three layers of metallic foli separated by glass substrates with wires of a first metal alloy bonding component in accordance with the present invention.

This invention is particularly adaptable for electrical through-hole connections in a multi-layer circuit device. Referring to FIG. 2A, a glass coated ceramic substrate 16 is illustrated with a through-hole 18. A copper foil 20 is disposed on the underside 22 of the glass coated substrate. Details of this structure are more fully provided in the application entitled "Hybride and Multi-Layer Circuitry" by Michael J. Pryor et al. described herein. A bonding wire 24 is inserted in the through-hole preferably after the copper foil 20 is disposed against the underside of the ceramic substrate 16. The wire may be cut flush with the top surface 26 of the substrate by any desired technique such as snipping or flame cutting. The cutting may be triggered by the wire making electrical contact with the foil 20.

In order to insure insertion of the wire into the through-hole during the manufacturing process, the wire preferably has a substantially smaller diameter than the diameter of the through-hole. The diameter of the wire is preferably less than about 25 mils, more preferably less than about 10 mils and most preferably less than about 5 mils. For example, if the diameter of the through-hole is about 5 mils, the diameter of the wire may be less than about 5 mils and preferably from about 2 to about 3 mils. These sizes are only exemplary and the wire may have any desired diameter as compared to that of the through-hole, assuming that the wire will contact and bond to layers of foil disposed at either end of the through-hole.

Figure 2B:
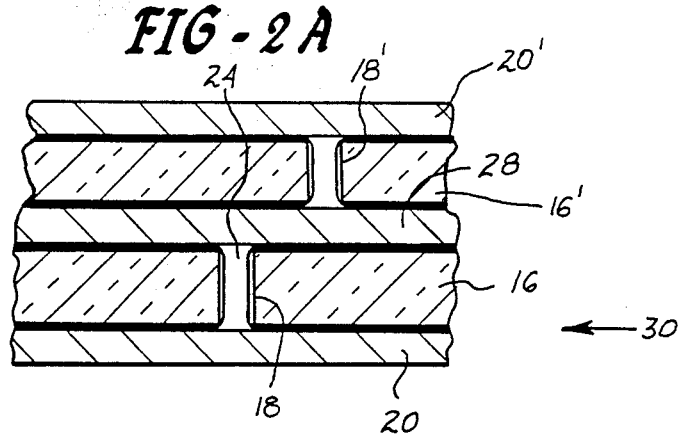

The next step, as illustrated in FIG. 2B, is to dispose a layer of foil 28 on the upper surface of the glass coated substrate 16. Then a second glass coated substrate 16′ with a foil 20′ on one surface is disposed on the foil layer 28 after a wire 24′ is inserted in a through-hole 18′. Primed reference numerals indicate elements which are essentially the same as the elements identified by the same unprimed reference numerals. The layers of foil 20,20′ and 28 may be bonded to the glazed substrates 16,16′ by heating the assembly 30 to a desired processing temperature within the range of about 600° to about 1000° C. The assembly 30 may be subjected to a lamination pressure of preferably less than about 300 psi to enhance the adherence of the substrates to the layers of foil. The multi-layer structure comprising two substrates and three layers of foil is exemplary and it is within the terms of the present invention to bond any number of stacked substrates and layers of foil as desired. The layers of foil may be formed into desired circuit configurations using any conventional technique such as photo-etching. This step may require the assembly of two or more substrates etched foil layers in between to be done in several steps so that the layers are etched prior to bonding between two stacked substrates.

The wires 24,24′ are preferably selected from a high expansivity of copper alloy which is in a semi-solid state at the process temperature required to bond the glass to the layers of foil and the substrate, generally within the range of about 600° to about 1000° C. The material of the wire is further selected so that in the semi-solid state, it has about 2 to about 40 volume percent of liquid and preferably between about 10 to about 30 volume percent of liquid. The cooling of the wire from the semi-solid condition to a solid condition results in the wires being brazed to the layers of foil 20,20′ and 28. It is important that the wires do not slump, i.e. distort or collapse, in the through-holes 18,18′ to the extent that they are not in contact with one or both of the layers of foil disposed on either end of each wire. Further, although a radius is illustrated at the bond between the wire and the layers of foil, it is within the terms of the present invention for the bond to occur without the formation of a fillet or radius. In the past, it has been known to use metals in the same solid condition as indicated by U.S. Pat. Nos. 3,902,544 and 4,106,956. However, the present invention does not require that the bonding component be formed in a particular way as described in these patents. It may actually be undesirable to construct the bonding component as in the prior art since it might lead to sag from the thixotropic qualities.

This unique means of interconnecting two or more layers of foil separated by a glazed substrate takes advantage of the substantially lower coefficient of thermal expansion (CTE) of the ceramic substrate, approximately $50 \times 10^{-7}$ in/in/°C., as compared with the higher CTE of the copper alloy wire, approximately $160 \times 10^{-7}$ in/in/°C. The differential in the CTE of the ceramic and the metallic wire results in a greater linear expansion of the wire as compared to the linear expansion of the through-hole. The wire is therefore pressed against the layers of foil, provided that the slump is kept within limits determined by the specific material system being processed. After the wire is brazed to the two layers of foil and the assembly is cooled, the bonded wire may be in a state of tension. Therefore, the material for the wire is preferably selected to have sufficient ductility after exposure to the bonding temperature regime required for the particular material system.

An alloy which may form a suitable wire in the environment described herein is a copper alloy consisting essentially of an element selected from the group consisting of: about 2 to about 13% Sn, about 0.2 to about 4% P, about 5 to about 15% Sb, about 3 to about 6% Si, about 4 to about 12% As and mixtures thereof; up to about 4% iron; and the balance copper. An example of a suitable alloy is a copper alloy containing about 8%

Sn, about 0.025% P, about 2% Fe and the remainder copper. Other examples are Cu with about 2% P, Cu with about 12% Sb, Cu with about 5% Si, Cu with about 9% As and ternary or quaternary combinations of these alloys. It is within the scope of the present invention to use any other alloy system having the desired high expansivity properties in conjunction with being in the described semi-solid state at the desired processing temperature.

The patents and patent applications set forth in this application are intended to be incorporated by reference herein.

It is apparent that there has been provided in accordance with the present invention a method of joining metallic components which fully satisfies the objects, means and advantages set forth hereinabove. While the invention has been described in combination with the embodiments thereof, it is evident that many alternative, modifications and variations will be apparent to those skilled in the art in light of the foregoing description. Accordingly, it is intended to embrace all such alternatives, modifications and variations as fall within the spirit and broad scope of the appended claims.

We claim:

1. A method of joining metallic components, comprising the steps of:
   providing a first metal or alloy component;
   providing a second metal or alloy component, said second metal or alloy component being spaced a desired distance from said first metal or alloy component;
   providing a first metal alloy bonding component of a length essentially equal to the desired distance prior to heating, said first metal alloy bonding component being disposed between and in contact with said first and second metal or alloy component;
   heating the assembly of said first and second metal or alloy components and said first metal alloy bonding component to a desired processing temperature within the range of about 600' to about 1000° C. wherein said first metal alloy bonding component is in the semi-solid condition with a volume percent of liquid from about 2 to about 40%, said first metal alloy bonding component retaining a length essentially equal to the desired distance while the semi-solid condition; and
   cooling said assembly whereby said first metal alloy bonding component is bonded to said first and second metal or alloy components and said second metal or alloy component is spaced essentially the desired distance from said first metal or alloy component.

2. The method of claim 1 including the step of selecting said first metal alloy bonding component to be in the semi-solid condition at the processing temperature with a volume percent of liquid from about 10 to about 30%.

3. The method of claim 1 including the step of selecting said first and second metal or alloy components of a material from the group consisting of copper and copper alloy.

4. The method of claim 3 including the step of selecting said first metal alloy bonding component from an alloy consisting essentially of an element from the group consisting of: about 2 to about 13% Sn, about 0.2 to about 4% P, about 5 to about 15% Sb, about 3 to about 6% Si, about 4 to about 12% As, and mixtures thereof; up to about 4% Fe; and the balance Cu.

5. The method of claim 4 including the step of selecting said first and second metal or alloy components from first and second layers of foil and said first metal alloy bonding component from a wire of less than about 25 mils in diameter.

6. The method of claim 5 including the step of selecting said wire with a diameter of less than about 10 mils.

7. The method of claim 6 including the step of selecting said wire with a diameter of less than about 5 mils.

8. A method of forming a multi-layer device comprising the steps of:
   providing a first metal or alloy component;
   providing a second metal or alloy component, said second metal or alloy component being spaced a desired distance from said first metal or alloy component;
   providing a first ceramic substrate, said first substrate having a glass coating on opposite surfaces thereof and a first through-hole extending through the glass coated substrate;
   disposing the first substrate between said first and second metal or alloy components whereby said first and second metal or alloy components are spaced the desired distance from each other;
   disposing a first metal alloy bonding component within said first through-hole whereby the ends of said first alloy bonding component contact said first and second metal or alloy components throughout a step of heating, said first metal alloy bonding component further being in selective contact with said first and second metal or alloy components;
   said step of heating including heating the first and second metal or alloy components, the first alloy bonding component and the substrate to a desired processing temperature within the range of about 600° C. to about 1000° C. wherein said first metal alloy bonding component is in the semi-solid condition with a volume percent of liquid from about 2 to about 40%; and
   cooling the first and second metal or alloy components, the first alloy bonding component and the substrate to bond the ends of the first alloy bonding component to the first and second metal or alloy components.

9. The method of claim 8 further including the step of selecting said first and second metal or alloy components from first and second layers of foil, respectively, and said first metal alloy bonding component from a wire of less than about 25 mils in diameter.

10. The method of claim 9 further including the step of forming electrical circuitry in said first and second layers of foil.

11. The method of claim 10 further including the steps of:
   providing a second ceramic substrate, said second ceramic substrate having a glass coating on opposite surfaces thereof and a second through-hole extending therethrough;
   disposing a first surface of said second ceramic substrate on said first layer of foil;
   providing a second metal alloy bonding component within said second through-hole, said second metal alloy bonding component being in the semi-solid condition with a volume percent of liquid from about 2 to about 40% at the desired processing temperature within the range of about 600° to about 1000° C.;

providing a third layer of metal or alloy foil, said third layer of metal or alloy foil being of substantially the same material as said first metal or alloy component;

disposing said third layer of foil on a second surface of said second ceramic substrate; and said step of heating including heating the resulting stacked layers of said first and second ceramic substrates and said first, second and third layers of foil to bond the ends of the second alloy bonding component to said first and third layers of foil and form a multi-layer circuit asembly.

12. The method of claim 4 including the step of forming electrical circuitry in said third layer of foil.

13. The method of claim 12 further including the step of selecting said second metal alloy bonding component of essentially the same material as said first metal alloy bonding component.

14. The method of claim 13 including the step of selecting said second metal alloy bonding component of a length to maintain contact with said first and third layers of metal or alloy foil throughout said step of heating, said second metal alloy bonding component further being in selective contact with said first and third layers of metal or alloy foil.

15. The method of claim 14 wherein said stacked layers are heated to a desired processing temperature within the range of about 600° C. to about 1000° C. where said first, second and third layers of foil are in the solid condition and the first and second metal alloy bonding components are in the semi-solid condition.

16. The method of claim 3 including the step of selecting said first metal alloy bonding component from a copper alloy of the group consisting of about 8% Sn, about 0.025% P, about 2% Fe and the remainder copper; about 2% P and the remainder copper; about 12% Sb and the remainder copper; about 5% Si and the remainder Cu; about 9% As and the remainder Cu; and ternary or quaternary combinations of these alloys.

* * * * *